(12) United States Patent
Galeotti et al.

(10) Patent No.: US 12,706,437 B2
(45) Date of Patent: Aug. 11, 2026

(54) SUBSTRATE FOR FACILITATING ONE OR MORE INTERCONNECTIONS OF AN OPTO-ELECTRICAL DEVICE

(71) Applicant: Lumentum Operations LLC, San Jose, CA (US)

(72) Inventors: Roberto Galeotti, Giussago (IT); Mario Bonazzoli, Cremona (IT); Flavio Dell'Orto, Desio (IT); Nicola Rettani, Pavia (IT)

(73) Assignee: Lumentum Operations LLC, San Jose, CA (US)

( * ) Notice: Subject to any disclaimer, the term of this patent is extended or adjusted under 35 U.S.C. 154(b) by 842 days.

(21) Appl. No.: 17/580,437

(22) Filed: Jan. 20, 2022

(65) Prior Publication Data

US 2023/0056968 A1 Feb. 23, 2023

Related U.S. Application Data

(60) Provisional application No. 63/234,536, filed on Aug. 18, 2021.

(51) Int. Cl.

| | |
|---|---|
| ***H01S 5/024*** | (2006.01) |
| ***H01S 5/0234*** | (2021.01) |
| ***H01S 5/02345*** | (2021.01) |
| ***H01S 5/0237*** | (2021.01) |

(52) U.S. Cl.

CPC ........ *H01S 5/02415* (2013.01); *H01S 5/0234* (2021.01); *H01S 5/02345* (2021.01); *H01S 5/0237* (2021.01); *H01S 5/02469* (2013.01)

(58) Field of Classification Search

CPC ....... H01S 5/022–0239; H01S 5/02415; H01S 5/02476; H01S 5/02469; H01S 5/02484; H01S 5/02492; H01L 25/00–50

See application file for complete search history.

(56) References Cited

U.S. PATENT DOCUMENTS

| | | | | |
|---|---|---|---|---|
| 10,312,178 | B2 * | 6/2019 | Kajihara | H01L 23/49861 |
| 2004/0080838 | A1 * | 4/2004 | Zbinden | H01L 23/38 359/820 |
| 2011/0044369 | A1 * | 2/2011 | Andry | G02B 6/4204 257/E31.127 |
| 2014/0079082 | A1 * | 3/2014 | Feng | H01S 5/101 372/20 |
| 2020/0358249 | A1 * | 11/2020 | Hakspiel | G01S 7/484 |

FOREIGN PATENT DOCUMENTS

| | | | | |
|---|---|---|---|---|
| WO | WO-03026084 A1 * | 3/2003 | | H01S 5/02415 |

* cited by examiner

*Primary Examiner* — Minsun O Harvey
*Assistant Examiner* — Fernanda Adriana Camacho Alanis
(74) *Attorney, Agent, or Firm* — Harrity & Harrity, LLP

(57) ABSTRACT

In some implementations, an opto-electrical device includes a heatsink; a thermally conductive element disposed on a first region of a surface of the heatsink; an adaptive thickness thermally conductive pad disposed on the thermally conductive element; an integrated circuit (IC) disposed on the adaptive thickness thermally conductive pad; a thermoelectric cooler (TEC) disposed on a second region of the surface of the heatsink; an opto-electrical chip disposed on the TEC; and a substrate disposed on the IC and the opto-electrical chip, wherein the substrate is configured to electrically connect the IC and the opto-electrical chip.

20 Claims, 11 Drawing Sheets

SUBSTRATE FOR FACILITATING ONE OR MORE INTERCONNECTIONS OF AN OPTO-ELECTRICAL DEVICE

RELATED APPLICATION

This application claims priority to U.S. Provisional Patent Application No. 63/234,536, for "SUBSTRATE FOR FACILITATING ONE OR MORE INTERCONNECTIONS," filed on Aug. 18, 2021, the content of which is incorporated by reference herein in its entirety.

TECHNICAL FIELD

The present disclosure relates generally to an opto-electrical device and to a substrate for facilitating one or more interconnections of the opto-electrical device.

BACKGROUND

A heatsink is a passive heat exchanger that transfers heat generated by an electronic device to a fluid medium, such as air or a liquid coolant. In the fluid medium, the heat generated by the device is dissipated away, thereby allowing regulation of the device's temperature.

SUMMARY

In some implementations, an opto-electrical device includes a heatsink; a first substructure disposed on the heatsink that includes: a thermally conductive element, an adaptive thickness thermally conductive pad disposed on the thermally conductive element, and an integrated circuit (IC) disposed on the adaptive thickness thermally conductive pad; a second substructure disposed on the heatsink that includes: a thermoelectric cooler (TEC), and an opto-electrical chip disposed on the TEC; and a substrate disposed on the first substructure and the second substructure, wherein the substrate is disposed on the IC and the opto-electrical chip, and wherein the substrate is configured to electrically connect the IC and the opto-electrical chip.

In some implementations, an opto-electrical device includes a heatsink; a thermally conductive element disposed on a first region of a surface of the heatsink; an adaptive thickness thermally conductive pad disposed on the thermally conductive element; an IC disposed on the adaptive thickness thermally conductive pad; a TEC disposed on a second region of the surface of the heatsink; an opto-electrical chip disposed on the TEC; and a substrate disposed on the IC and the opto-electrical chip, wherein the substrate is configured to electrically connect the IC and the opto-electrical chip.

In some implementations, a method of forming an opto-electrical device includes disposing an IC and an opto-electrical chip on a substrate to form a first subassembly; disposing a TEC and a thermally conductive element on a heatsink to form a second subassembly; causing the first subassembly and the second subassembly to be oriented such that the IC and the opto-electrical chip of the first subassembly face the TEC and the thermally conductive element of the second subassembly; disposing an adaptive thickness thermally conductive pad on the thermally conductive element; and disposing the first subassembly on the second subassembly such that the IC is disposed on the adaptive thickness thermally conductive pad and the opto-electrical chip is disposed on the TEC.

DETAILED DESCRIPTION

Figure 1A:
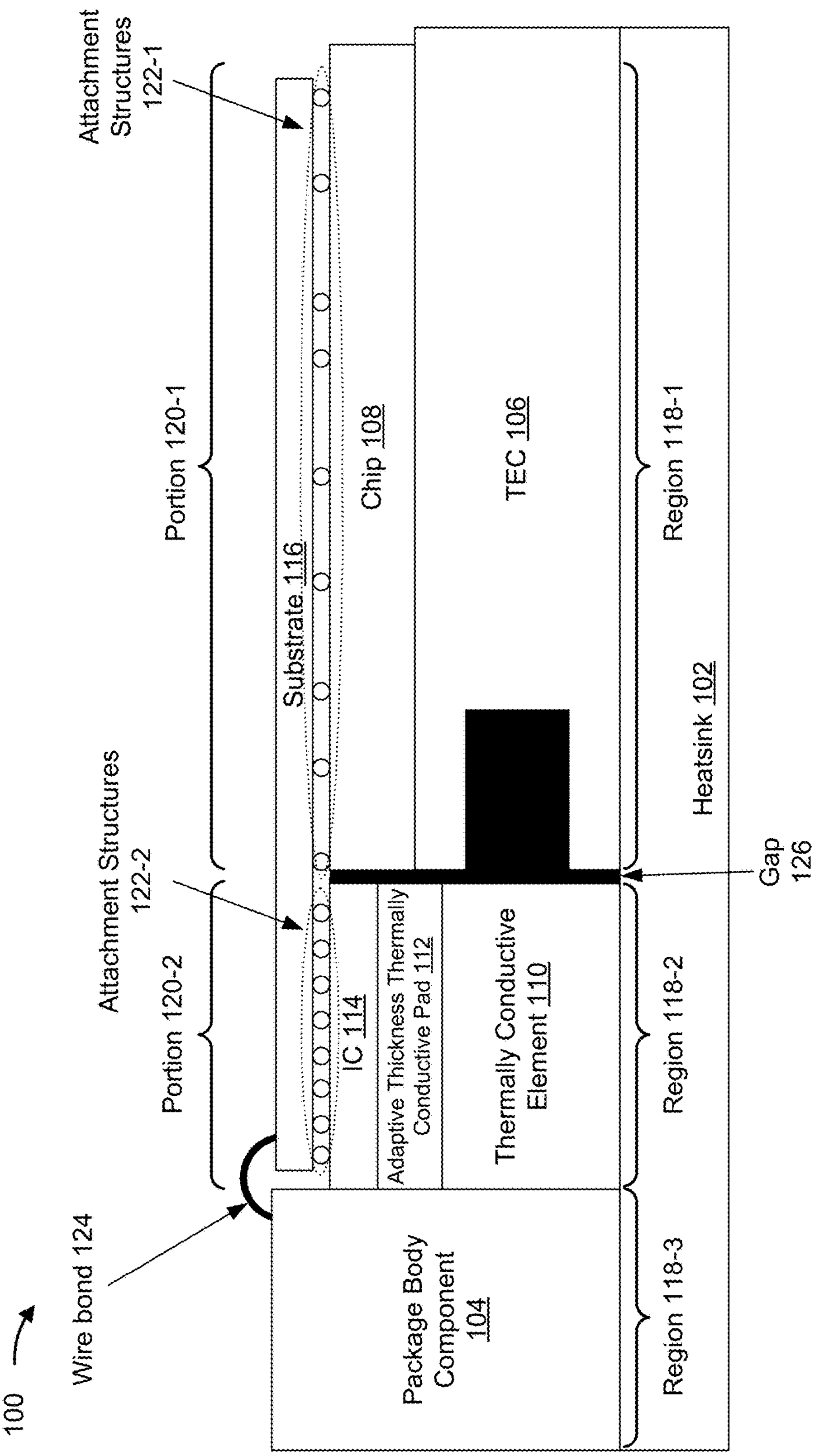
FIGS. 1A-1B are diagrams of an example opto-electrical device described herein.

The following detailed description of example implementations refers to the accompanying drawings. The same reference numbers in different drawings may identify the same or similar elements.

Two elements, such as an integrated circuit (IC) and an optical/electrical chip (hereinafter referred to as a "chip"), are typically positioned adjacent to each other (e.g., in a lateral direction over a heatsink) within an opto-electrical device. In many cases, the two elements have high radio frequency (RF) requirements (e.g. 90 GHz or higher) and cannot be interconnected with wire bonds because inductance associated with the wire bonds impedes an RF performance of the two elements. However, the two elements often vary in height, which makes providing a high RF interconnection between the two elements and providing good thermal dissipation for the two elements difficult. For example, a substrate could be used to provide a high RF interconnection between the two elements, but the substrate requires the two elements to have a same height (e.g., within a tolerance) to be able to connect to both the elements.

Further, each element is typically included in a stack that includes other components (e.g., for providing thermal dissipation) of the opto-electrical device. For example, an IC is typically included in a first stack of components and a chip is typically included in a second stack of components, wherein the first stack of components and the second stack of components are positioned adjacent to each other on a heatsink of the opto-electrical device. A total height, and a tolerance associated with the total height, of the first stack is based on a sum of individual heights and tolerances (e.g., manufacturing tolerances) of the IC and other components of the first stack, and a total height, and a tolerance associated with the total height, of the second stack is based on a sum of individual heights and tolerances (e.g., manufacturing tolerances) of the chip and other components of the second stack. Consequently, the first stack and the second stack each have a large height variability and therefore a difference between the heights of the first stack and the second stack also has large variability. This makes it difficult to consistently and repeatedly provide, in any particular opto-electrical device, a first stack and a second stack that have heights that are substantially the same, within a tolerance, such that a substrate can be used to provide a high RF interconnection between an IC of the first stack and a chip of the second stack (e.g., by having the substrate lay flat on the first stack and the second stack to provide the high RF connection).

Some implementations described herein provide an opto-electrical device. The opto-electrical device includes an IC, a chip, a package, a substrate (also termed a "flip-chip substrate" or an "interconnection substrate"), a thermally conductive element, one or more adaptive thickness thermally conductive pads, a TEC, and a heatsink. The substrate is disposed on the IC and the chip (e.g., on respective top surfaces of the IC and the chip). The IC is disposed on a first adaptive thickness thermally conductive pad, which is disposed on the thermally conductive element. The chip is disposed on the TEC, or, alternatively, the chip is disposed on a second adaptive thickness thermally conductive pad, which is disposed on the TEC. The thermally conductive element and the TEC are disposed on respective regions of the heatsink (e.g., respective regions of a top surface of the heatsink). In this way, the opto-electrical device includes two individual substructures. A first substructure includes the IC, the first adaptive thickness thermally conductive pad, and the thermally conductive element, and is disposed on a first region of the heat sink. The second substructure includes the chip, (optionally) the second adaptive thickness thermally conductive pad, and the TEC, and is disposed on the second region of the heat sink.

The substrate described herein facilitates one or more connections between the IC and the chip such that high RF performance requirements and high thermal dissipation requirements are met. For example, the substrate includes one or more electrically conductive structures that electrically connect the IC and the chip and that enable a high RF performance, such as greater than or equal to 90 gigahertz (Ghz) (e.g., because the one or more electrically conductive structures have a lower inductance than that of wire bonds). Further, the one or more adaptive thickness thermally conductive pads cause the first substructure and the second substructure to have similar thicknesses. For example, the first adaptive thickness thermally conductive pad may fill a space between the IC and the thermally conductive element included in the first substructure during assembly of the opto-electrical device. The first adaptive thickness thermally conductive pad may be compressible (e.g., may have a pillow-like structure) and therefore may compensate for any respective variabilities in thicknesses and tolerances of the IC and the thermally conductive element, which reduces a variability of a thickness and tolerance of the first substructure. As another example, the second adaptive thickness thermally conductive pad may fill a space between the chip and the TEC included in the second substructure during assembly of the opto-electrical device. The second adaptive thickness thermally conductive pad may be compressible (e.g., may have a pillow-like structure) and therefore may compensate for any respective variabilities in thicknesses and tolerances of the chip and the TEC, which reduces a variability of a thickness and tolerance of the second substructure. Accordingly, the first substructure and the second substructure can be consistently and repeatedly assembled to have matching thicknesses (e.g., within a tolerance, such as 100 micrometers (μm)), which enables the substrate to lay flat on the IC of the first substructure and the chip of the second substructure (e.g., without bending the substrate) and thereby electrically connect the IC and the chip.

Moreover, the substrate is disposed on the IC and the chip in a flip-chip configuration, which allows the IC and the chip to be connected to the substrate via one or more attachment structures. A set of the one or more attachment structures may provide an electrical connection between the substrate and the IC and the chip, respectively, which enables a high RF interconnection (e.g., because the set of the one or more attachment structures have a low inductance, as compared to that that of wire bonds).

In some implementations, one or more electrical elements that would otherwise be included in the IC and/or the chip are included in the substrate. For example, the substrate may include one or more resistors, one or more traces, and/or one or more other electrical elements that would otherwise be included in the chip and/or the IC. In this way, in some implementations, the one or more electrical elements of the substrate may complete the chip and/or the IC (e.g., the chip and/or the IC are incomplete without the one or more electrical elements of the substrate). Accordingly, an electrical complexity, a size (e.g., a lateral footprint), a power consumption requirement of the chip and/or the IC may be respectively reduced by including the one or more electrical elements in the substrate 116. Further, an electrical element, of the one or more electrical elements, may provide a functionality associated with operation of the IC or a functionality associated with operation of the chip, which simplifies a design of the IC and/or the chip. Accordingly, in some implementations, the IC and/or the chip are different than or provide different functionalities than conventional ICs and chips (e.g., because the one or more electrical elements have been offloaded from the IC and/or chip to the substrate).

Moreover, one or more dimensions and an aspect ratio of the substrate can be adapted to be compatible with a die bonding process and/or die bonding tools. Additionally, or alternatively, the substrate can have a particular size and/or shape to increase a durability and/or robustness of the opto-electrical device during an operative life of the opto-electrical device. For example, the substrate may be designed to enable the opto-electrical device to withstand one or more stresses, such as applied thermomechanical stresses (e.g., that result from element warpage, movements due to coefficient of thermal expansion (CTE) mismatches, and/or other stresses). Accordingly, the substrate may be disposed on, for example, an entirety of the chip or a particular portion of the chip and/or an entirety of the IC or a particular portion of the IC, depending on a durability and/or robustness requirement of the opto-electrical device.

Further, some implementations described herein enable the IC and the chip to be positioned within the opto-electrical device such that heat generated by the IC and the chip are dissipated in a same vertical direction (e.g., in a downward direction). For example, heat generated by the IC is thermally conducted downward by the first adaptive thickness thermally conductive pad, the thermally conductive element, and the heatsink, and heat generated by the chip is thermally conducted downward by the second adaptive thickness thermally conductive pad and/or the TEC and the heatsink.

Figure 1B:
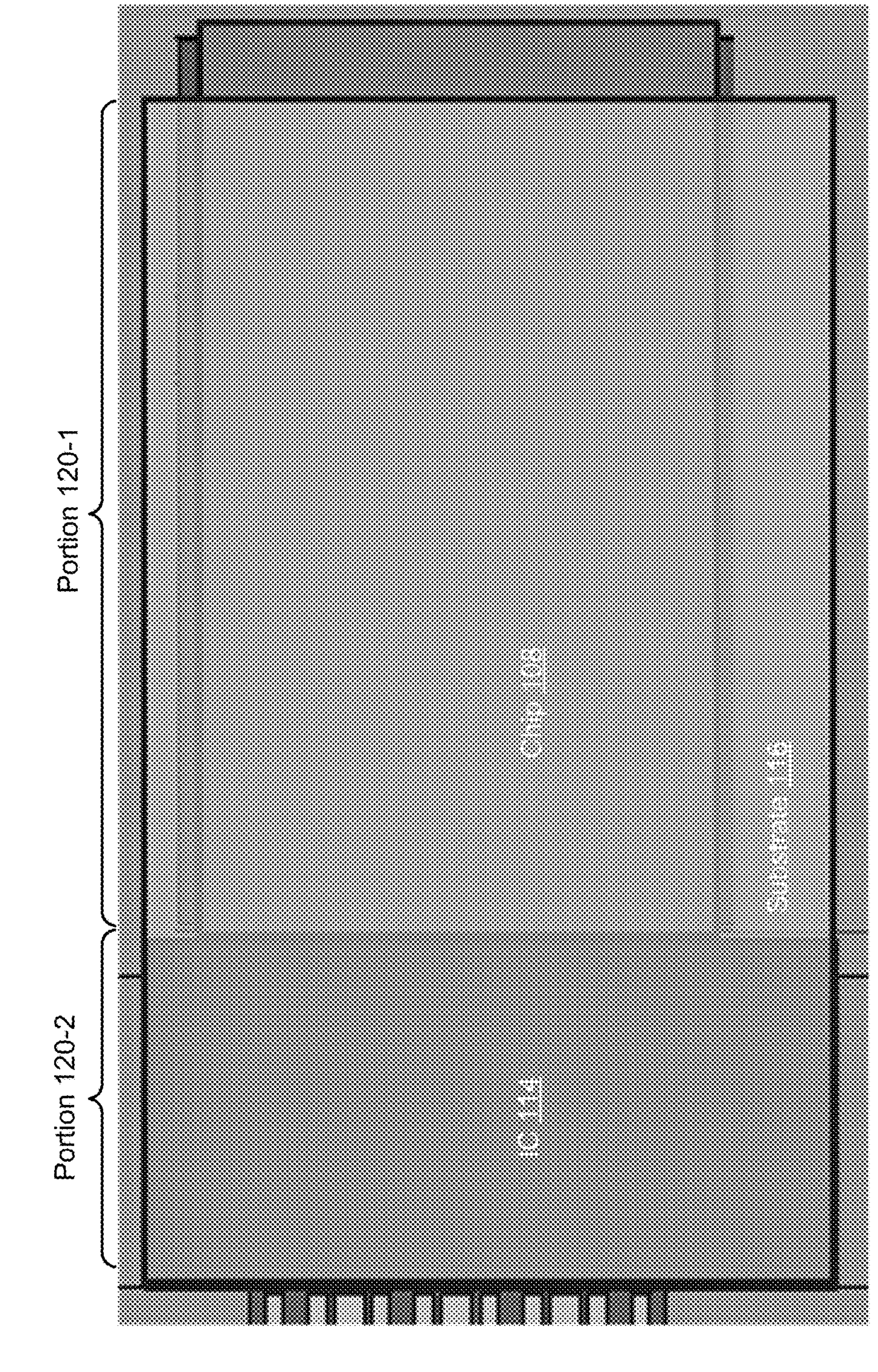

FIGS. 1A-1B are diagrams of an example opto-electrical device 100, such as a coherent driver and modulator (CDM), an integrated coherent receiver (ICR), or a transmitter/receiver optical subassembly (TROSA). FIG. 1A illustrates a side cut-away view of the example opto-electrical device 100. FIG. 1B illustrates a top view of the example opto-electrical device 100.

As shown in FIGS. 1A-1B, the example opto-electrical device 100 may include a heatsink 102, a package body component 104, a TEC 106, an opto-electrical chip (referred to herein as a “chip”) 108, a thermally conductive element 110, an adaptive thickness thermally conductive pad 112, an IC 114, and/or a substrate 116.

The heatsink 102 may be positioned on a particular side of the opto-electrical device 100. For example, as shown in FIG. 1A, the heatsink 102 may be positioned on a bottom side of the opto-electrical device 100. The heatsink 102 may be a base of a package of the opto-electrical device 100 (e.g., upon which other components of the opto-electrical device are disposed and/or mounted, as further described herein). The package body component 104 may comprise ceramic or a similar material and may be, for example, a sidewall, a frame, a housing, or another component of the package of the opto-electrical device 100. The package body component 104 may be configured to provide mechanical support and/or an enclosure for one or more other components of the opto-electrical device 100. The package may include other components (not shown in FIG. 1A), such as a feedthrough (e.g., a metal optical feedthrough), other package body components 104, a lid, a lid sealing ring, and/or other components.

The heatsink 102 may be configured to thermally conduct heat (e.g., that is generated by one or more other components of the opto-electrical device 100) away from the opto-electrical device 100. For example, as shown in FIG. 1A, the heatsink 102 may be configured to thermally conduct heat in a vertical direction (e.g., in a downward direction) from the opto-electrical device 100 to another component or system external to the opto-electrical device 100 (not pictured in FIG. 1A), such as another heatsink or another thermally conductive element, that is below the heatsink 102. In this way, the heatsink 102 may be configured to facilitate dissipation of heat generated by the opto-electrical device 100 and thereby enable temperature regulation of the opto-electrical device 100.

In some implementations, each of the package body component 104, the TEC 106, and the thermally conductive element 110 may be disposed on the heatsink 102 (e.g., on respective regions 118 of a surface of the heatsink 102). For example, as shown in FIG. 1A, a bottom surface of the TEC 106 may be disposed on a first region 118-1 of a top surface of the heatsink 102, a bottom surface of the thermally conductive element 110 may be disposed on a second region 118-2 of the top surface of the heatsink 102, and a bottom surface of the package body component 104 may be disposed on a third region 118-3 of the top surface of the heatsink 102.

The TEC 106 may include, for example, one or more Peltier elements, and may be configured to thermally conduct heat (e.g., that is generated by one or more other components of the opto-electrical device 100) to the heatsink 102. For example, as shown in FIG. 1A, the TEC 106 may be configured to thermally conduct heat (e.g., that is generated by the chip 108 and/or the substrate 116) in a vertical direction (e.g., in a downward direction) from the chip 108 to the heatsink 102. The TEC 106 may be configured to maintain a temperature of the chip 108 and to conduct heat through the heatsink 102. In this way, the TEC 106 may be configured to facilitate dissipation of heat generated by the opto-electrical device 100 and thereby enable temperature regulation of the opto-electrical device 100.

In some implementations, the chip 108 may be disposed on the TEC 106. For example, as shown in FIG. 1A, a bottom surface of the chip 108 may be disposed on a top surface of the TEC 106. The chip 108 may be an opto-electrical chip (e.g., that comprises indium phosphide (InP), lithium niobate ($LiNbO_3$), silicon (Si), and/or another material), such as an opto-electrical modulator chip, an opto-electrical semiconductor laser chip, or an opto-electrical photodetector chip. Additionally, or alternatively, the chip 108 may include a first set of electrical elements of an opto-electrical chip (e.g., the chip 108 includes a partial portion of the opto-electrical chip, where a second set of electrical elements that complete the opto-electrical chip are included in the substrate 116, as further described herein). In some implementations, the chip 108 may generate heat (e.g., when the chip 108 and/or the opto-electrical device 100 is in an operative state). The heat may be thermally conducted by the TEC 106 in a vertical direction (e.g., in a downward direction) from the chip 108 to the heatsink 102.

The thermally conductive element 110 may include, for example, tungsten (W), a W alloy, copper (Cu), a Cu alloy, a CuW alloy, aluminum nitride (AlN), carbon (C) (e.g., diamond-like carbon (DLC)), and/or another material with high thermally conductivity. The thermally conductive element 110 may be configured to thermally conduct heat (e.g., that is generated by one or more other components of the opto-electrical device 100) to the heatsink 102. For example, as shown in FIG. 1A, the thermally conductive element 110 may be configured to thermally conduct heat (e.g., that is generated by the IC 114 and/or the substrate 116) in a vertical direction (e.g., a downward direction) from the adaptive thickness thermally conductive pad 112 to the heatsink 102. The thermally conductive element 110 may be configured to provide higher thermal conductivity than a gas, such as air (e.g., which would otherwise conduct heat generated by the IC 114 to the heatsink 102 if the thermally conductive element 110 and the adaptive thickness thermally conductive pad 112 were not present in the opto-electrical device 100). In this way, the thermally conductive element 110 may be configured to facilitate dissipation of heat generated by the opto-electrical device 100 and thereby enable temperature regulation of the opto-electrical device 100.

In some implementations, the adaptive thickness thermally conductive pad 112 may be disposed on the thermally conductive element 110. For example, as shown in FIG. 1A, a bottom surface of the adaptive thickness thermally conductive pad 112 may be disposed on a top surface of the thermally conductive element 110. The adaptive thickness thermally conductive pad 112 may include, for example, a resin and/or a polymer (e.g., doped with a metal such as W, Cu, Mo, and/or Ag, and/or another thermally conductive material) and may be configured to thermally conduct heat (e.g., that is generated by one or more other components of the opto-electrical device 100) to the thermally conductive element 110, which may conduct the heat to the heatsink 102. For example, as shown in FIG. 1A, the adaptive thickness thermally conductive pad 112 may be configured to thermally conduct heat (e.g., that is generated by the IC 114 and/or the substrate 116) in a vertical direction (e.g., in a downward direction) from the IC 114 to the thermally conductive element 110, which may conduct the heat to the heatsink 102. In this way, the adaptive thickness thermally conductive pad 112 may be configured to facilitate dissipation of heat generated by the opto-electrical device 100 and thereby enable temperature regulation of the opto-electrical device 100.

While FIG. 1A shows the adaptive thickness thermally conductive pad 112 disposed on the thermally conductive element 110, in some implementations, the adaptive thickness thermally conductive pad 112 may be disposed on the heatsink 102 and the thermally conductive element 110 may be disposed on the adaptive thickness thermally conductive pad 112. Accordingly, the thermally conductive element 110 may be configured to thermally conduct heat (e.g., that is generated by the IC 114 and/or the substrate 116) in a vertical direction (e.g., in a downward direction) from the IC 114 to the adaptive thickness thermally conductive pad 112, which may conduct the heat to the heatsink 102.

In some implementations, the IC 114 may be disposed on the adaptive thickness thermally conductive pad 112. For example, as shown in FIG. 1A, a bottom surface of the IC 114 may be disposed on a top surface of the adaptive thickness thermally conductive pad 112. The IC 114 may include, for example, a driver and/or a transimpedance amplifier (TIA). Additionally, or alternatively, the IC 114 may include a set of electrical elements of a driver and/or a TIA (e.g., the IC 114 is a partial driver and/or a partial TIA, where other electrical elements that complete the partial driver and/or partial TIA are included in the substrate 116, as further described herein). The IC 114 may be configured to provide an electrical signal to the chip 108 (e.g., to drive the chip 108). In some implementations, the IC 114 may generate heat (e.g., when the IC 114 and/or the opto-electrical device 100 are in an operative state). The heat may be thermally conducted by the adaptive thickness thermally conductive pad 112 and/or the thermally conductive element 110 in a vertical direction (e.g., in a downward direction) from the IC 114 to the heatsink 102.

The substrate 116 may be disposed on the chip 108 and the IC 114 (e.g., one or more portions 120 of the substrate 116 may be disposed on the chip 108 and the IC 114). In some implementations, a first portion 120-1 of the substrate 116 may be disposed on the chip 108 and a second portion 120-2 of the substrate 116 may be disposed on the IC 114. For example, as shown in FIG. 1A, a region of a bottom surface of the substrate 116 that is associated with the first portion 120-1 of the substrate 116 may be disposed on a top surface of the chip 108. As another example, as further shown in FIG. 1A, a region of the bottom surface of the substrate 116 that is associated with the second portion 120-2 of the substrate 116 may be disposed on a top surface of the IC 114. In some implementations, the substrate 116 may be disposed on at least a portion of the chip 108 and at least a portion of the IC 114. For example, as shown in FIG. 1B, the first portion 120-1 of the substrate 116 may be disposed on an entirety of the top surface of the chip 108 and the second portion 120-2 of the substrate 116 may be disposed on an entirety of the top surface of the IC 114.

In some implementations, the substrate 116 may be a hard substrate or a flexible substrate. The substrate 116 may comprise, for example, a laminate material (e.g., a high frequency laminate material), a ceramic material, or another material. In some implementations, the substrate 116 may be configured to electrically connect the IC 114 and the chip 108. For example, the substrate 116 may include one or more electrically conductive structures (not shown in FIGS. 1A-1B), such as one or more microstrip lines, one or more vias, and/or one or more other electrically conductive structures, that electrically connect the IC 114 and the chip 108 (e.g., when the substrate 116 is disposed on the IC 114 and the chip 108). In some implementations, the substrate 116 may include one or more electrical elements (not shown in FIGS. 1A-1B). For example, the substrate 116 may include one or more resistors, one or more traces (e.g., one or more low frequency traces), and/or one or more other electrical elements on a surface, such as a top surface, of the substrate 116 or within the substrate 116. The one or more electrical elements may be connected to the chip 108 and/or the IC 114 via the one or more electrically conductive structures.

In some implementations, the substrate 116 may include one or more electrical elements to complete the chip 108 and/or the IC 114. For example, the chip 108 may include a first set of electrical elements of an opto-electrical chip (e.g., the chip 108 includes a first partial portion of the opto-electrical chip) and the substrate 116 may include a second set of electrical elements of the opto-electrical chip (e.g., the substrate 116 includes a second partial portion of the opto-electrical chip), such that, together, the first set of electrical elements and the second set of electrical elements form the opto-electrical device-electrical chip (e.g., the first partial portion and the second partial portion complete the opto-electrical chip). As another example, the IC 114 may include a first set of electrical elements of a driver and/or a TIA (e.g., the IC 114 includes a first partial portion of the driver and/or the TIA) and the substrate 116 may include a second set of electrical elements of the driver and/or the TIA (e.g., the substrate 116 includes a second partial portion of the driver and/or the TIA), such that, together, the first set of electrical elements and the second set of electrical elements form the driver and/or the TIA (e.g., the first partial portion and the second partial portion complete the driver and/or the TIA). In this way, an electrical complexity, a size (e.g., a lateral footprint), and/or a power consumption requirement of the chip 108 and/or the IC 114 may be respectively reduced (e.g., by including sets of electrical elements, as described above, in the substrate 116).

In some implementations, the substrate 116 may include one or more bondpads (not shown in FIGS. 1A-1B) that are configured to attach to one or more bondpads of the chip 108 and/or one or more bondpads of the IC 114 (not shown in FIGS. 1A-1B). For example, the substrate 116 may have a "flip-chip" configuration, such that the each of the one or more bondpads of the substrate 116 may be positioned on the bottom surface of the substrate 116 and may have a flip-chip bondpad profile (e.g., each bondpad may have a particular size, shape, and/or orientation to be used in the flip-chip configuration). The one or more bondpads of the chip 108 may be positioned on the top surface of chip 108 and/or the one or more bondpads of the IC 114 may be positioned on the top surface of the IC 114. Accordingly, the one or more bondpads of the substrate 116 may be correspondingly disposed on the one or more bondpads of the chip 108 and/or the one or more bondpads of the IC 114 (e.g., a particular bondpad of the substrate 116 may be disposed on a particular bondpad of the chip 108 or a particular bondpad of the IC 114).

In some implementations, one or more attachment structures 122 may connect the substrate 116 to the chip 108 and/or the IC 114. For example, as shown in FIG. 1A, a first set of attachment structures 122-1 (e.g., comprising one or more attachment structures 122) may connect the substrate 116 to the chip 108, and/or a second set of attachment structures 122-2 (e.g., comprising one or more attachment structures 122) may connect the substrate 116 to the IC 114. A set of attachment structures may include one or more attachment structures that provide a mechanical connection (e.g., one or more non-metal-doped solder balls and/or electrically non-conductive structures), one or more attachment structures that provide an electrical connection (e.g., one or more solder balls that are doped with a metal such as Cu, Ag, gold (Au), tin (Sn), and/or electrically conductive materials), and/or one or more attachment structures that provide a mechanical connection and an electrical connection (e.g., one or more structures that comprise at least one non-metal-doped solder ball and at least one metal-doped solder ball).

Accordingly, the first set of attachment structures 122-1 may be configured to mechanically and/or electrically connect the substrate 116 to the chip 108. For example, a first attachment structure of the first set of attachment structures 122-1 may be disposed between a particular bondpad of the substrate 116 and a particular bondpad of the chip 108, to electrically connect the substrate 116 to the chip 108. In some implementations, the particular bondpad of the substrate 116 may have a flip-chip bondpad profile (e.g., a particular size, shape, and/or orientation) to facilitate an electrical connection to the particular bondpad of the chip 108 via the first attachment structure of the first set of attachment structures 122-1. As another example, a second attachment structure of the first set of attachment structures 122-1 may be disposed between a particular structural component of the substrate 116 and a particular structural component of the chip 108 to mechanically connect the substrate 116 to the chip 108. At least one of the particular structural component of the substrate 116 or the particular structural component of the chip 108 may be configured to facilitate a mechanical connection to the other via the second attachment structure of the first set of attachment structures 122-1. In an additional example, a third attachment structure of the first set of attachment structures 122-1 may be disposed between another particular bondpad of the substrate 116 (e.g., that has a flip-chip bondpad profile) and another particular bondpad of the chip 108, to electrically and mechanically connect the substrate 116 to the chip 108.

Additionally, or alternatively, the second set of attachment structures 122-2 may be configured to mechanically and/or electrically connect the substrate 116 to the IC 114. For example, a first attachment structure of the second set of attachment structures 122-2 may be disposed between a particular bondpad of the substrate 116 and a particular bondpad of the IC 114 to electrically connect the substrate 116 to the IC 114. In some implementations, the particular bondpad of the substrate 116 may have a flip-chip bondpad profile (e.g., a particular size, shape, and/or orientation) to facilitate an electrical connection to the particular bondpad of the IC 114 via the first attachment structure of the second set of attachment structures 122-2. As another example, a second attachment structure of the second set of attachment structures 122-2 may be disposed between a particular structural component of the substrate 116 and a particular structural component of the IC 114, to mechanically connect the substrate 116 to the IC 114. At least one of the particular structural component of the substrate 116 or the particular structural component of the IC 114 may be configured to facilitate a mechanical connection to the other via the second attachment structure of the second set of attachment structures 122-2. In an additional example, a third attachment structure of the second set of attachment structures 122-2 may be disposed between another particular bondpad of the substrate 116 (e.g., that has a flip-chip bondpad profile) and another particular bondpad of the IC 114, to electrically and mechanically connect the substrate 116 to the IC 114.

In some implementations, the adaptive thickness thermally conductive pad 112 may be a thermally conductive "pillow" pad (e.g., that has a compressive property under particular environmental conditions, such as environmental conditions associated with forming or assembling the opto-electrical device 100, as described elsewhere herein). For example, the adaptive thickness thermally conductive pad 112 may include a compressible resin and/or a compressible polymer that is deposited between the thermally conductive element 110 and the IC 114 during assembly of the opto-electrical device 100. The adaptive thickness thermally conductive pad 112 may be "soft" when initially disposed on the thermally conductive element 110 and may compress to fill a space (e.g., to conform to one or more dimensions of the space, such as a length, width, and thickness of the gap) between the thermally conductive element 110 and the IC 114 (e.g., as described herein in relation to FIG. 4B). The adaptive thickness thermally conductive pad 112 may cure (e.g., by applying heat) and may thereby become "hard," such that the adaptive thickness thermally conductive pad 112 is minimally compressible due to pressure changes, temperature changes, or other environmental changes (e.g., after curing).

In some implementations, the adaptive thickness thermally conductive pad 112 may be configured to have a particular thickness (e.g., a particular vertical height, as shown in FIG. 1A) when the opto-electrical device 100 is assembled (e.g., after the adaptive thickness thermally conductive pad 112 has cured). For example, the opto-electrical device 100 may comprise a first substructure that includes the TEC 106 and the chip 108 (e.g., that is disposed over the region 118-1 of the top surface of the heatsink 102) and a second substructure that includes the thermally conductive element 110, the adaptive thickness thermally conductive pad 112, and the IC 114 (e.g., that is disposed over the region 118-2 of the top surface of the heatsink 102). The adaptive thickness thermally conductive pad 112 may have a thickness that matches (e.g., to be equal to, within a tolerance, such as less than or equal to 50 micrometers (μm)) a thickness of a space that would otherwise exist between the thermally conductive element 110 and the IC 114 (e.g., during assembly of the opto-electrical device as further described herein).

In some implementations, the adaptive thickness thermally conductive pad 112 may have a particular thickness to cause a thickness (e.g., a vertical height) of the second substructure to match (e.g., to be equal to, within a tolerance, such as less than or equal to 50 micrometers (μm)) a thickness (e.g., a vertical height) of the first substructure. For example, a difference between a thickness of the first substructure and a thickness of the second substructure may satisfy (e.g., be less than or equal to) a difference threshold (e.g., that is less than or equal to 50 μm). Put another way, the particular thickness of the adaptive thickness thermally conductive pad 112 may match a difference between a cumulative thickness of the chip 108 and the TEC 106 and a cumulative thickness of the thermally conductive element 110 and the IC 114.

Additionally, or alternatively, the first substructure may include an additional adaptive thickness thermally conductive pad 112 (e.g., between the TEC 106 and the chip 108, not shown in FIG. 1A). In some implementations, the additional adaptive thickness thermally conductive pad 112 may have a particular thickness to cause a thickness (e.g., a vertical height) of the first substructure to match (e.g., to be equal to, within a tolerance, such as less than or equal to 50 μm) a thickness (e.g., a vertical height) of the first substructure (e.g., in a similar manner as that described above).

Accordingly, the particular thickness of the adaptive thickness thermally conductive pad 112 may cause the substrate 116 to lay substantially flat (e.g., substantially parallel to a horizontal plane of the opto-electrical device 100 and/or substantially perpendicular to the vertical direction of the opto-electrical device 100), within a threshold number of degrees (e.g. within 3 degrees), when disposed on the first substructure and the second substructure (e.g., on the respective top surfaces of the chip 108 and the IC 114). The threshold number of degrees may be less than or equal to three degrees (e.g., from the horizontal plane).

In this way, the adaptive thickness thermally conductive pad 112 may be configured to have a particular thickness, or a particular range of thicknesses, that accommodates for a difference in respective tolerance stack-ups of the first substructure and the second substructure of the opto-electrical device 100. This enables the substrate 116 to lay substantially flat on the IC 114 and the chip 108 and thereby provide a robust electrical connection between the substrate 116 and the IC 114, and the substrate 116 and the chip 108. Further, this facilitates dissipation of heat generated by the chip 108 and the substrate 116 via the TEC 106 and the heatsink 102, and dissipation of heat generated by the IC 114 and the substrate 116 via the adaptive thickness thermally conductive pad 112, the thermally conductive element 110, and the heatsink 102, thereby enabling temperature regulation of the opto-electrical device 100.

While some implementations described herein are directed to a single adaptive thickness thermally conductive pad 112 included in the opto-electrical device 100 (e.g., in the second substructure that includes the thermally conductive element 110, the adaptive thickness thermally conductive pad 112, and the IC 114), additional implementations include an additional adaptive thickness thermally conductive pad 112 (e.g., that has a same or similar configuration as the adaptive thickness thermally conductive pad 112, as described above) included in the opto-electrical device 100 (e.g., in the first substructure that includes the TEC 106 and the chip 108). For example, the additional adaptive thickness thermally conductive pad 112 may be disposed between the chip 108 and the TEC 106 or between the TEC 106 and the region 118-1 of the top surface of the heatsink 102. The additional adaptive thickness thermally conductive pad 112 may include a compressible resin and/or a compressible polymer and may have a compressible property that is similar to that of the adaptive thickness thermally conductive pad 112. The additional adaptive thickness thermally conductive pad 112 may have a thickness that matches (e.g., to be equal to, within a tolerance, such as less than or equal to 50 μm) a thickness of a space that would otherwise exist between the TEC 106 and the chip 108 (e.g., during assembly of the opto-electrical device as further described herein). Accordingly, the adaptive thickness thermally conductive pad 112 and the additional adaptive thickness thermally conductive pad 112 may have respective thicknesses to cause a thickness (e.g., a vertical height) of the first substructure to match (e.g., to be equal to), within a tolerance (e.g., less than or equal to 50 μm), a thickness (e.g., a vertical height) of the second substructure.

In some implementations, at least one wire bond 124 may connect the package body component 104 (e.g., an interconnection of the package body component 104) to the substrate 116, the chip 108, and/or the IC 114. For example, the at least one wire bond 124 may directly connect the package body component 104 to the chip 108 and/or the IC 114. As another example, as shown in FIG. 1A, the at least one wire bond 124 may directly connect the package body component 104 to one or more bondpads of the substrate 116, and the substrate 116 may provide an electrical connection to the chip 108 and/or the IC 114 (e.g., in a similar manner as that described above).

As further shown in FIG. 1A, a gap 126 (shown in black) may exist between the first substructure (e.g., that includes the TEC 106 and the chip 108) and the second substructure (e.g., that includes the thermally conductive element 110, the adaptive thickness thermally conductive pad 112, and the IC 114). The gap 126 may be a free space gap and may be sufficiently wide to ensure that the TEC 106 and the thermally conductive element 110 do not touch each other during or after formation of the opto-electrical device 100.

As indicated above, FIGS. 1A-1B are provided as an example. Other examples may differ from what is described with regard to FIGS. 1A-1B. In practice, the opto-electrical device 100 may include additional layers and/or elements, fewer layers and/or elements, different layers and/or elements, or differently arranged layers and/or elements than those shown in FIGS. 1A-1B.

Figure 2A:
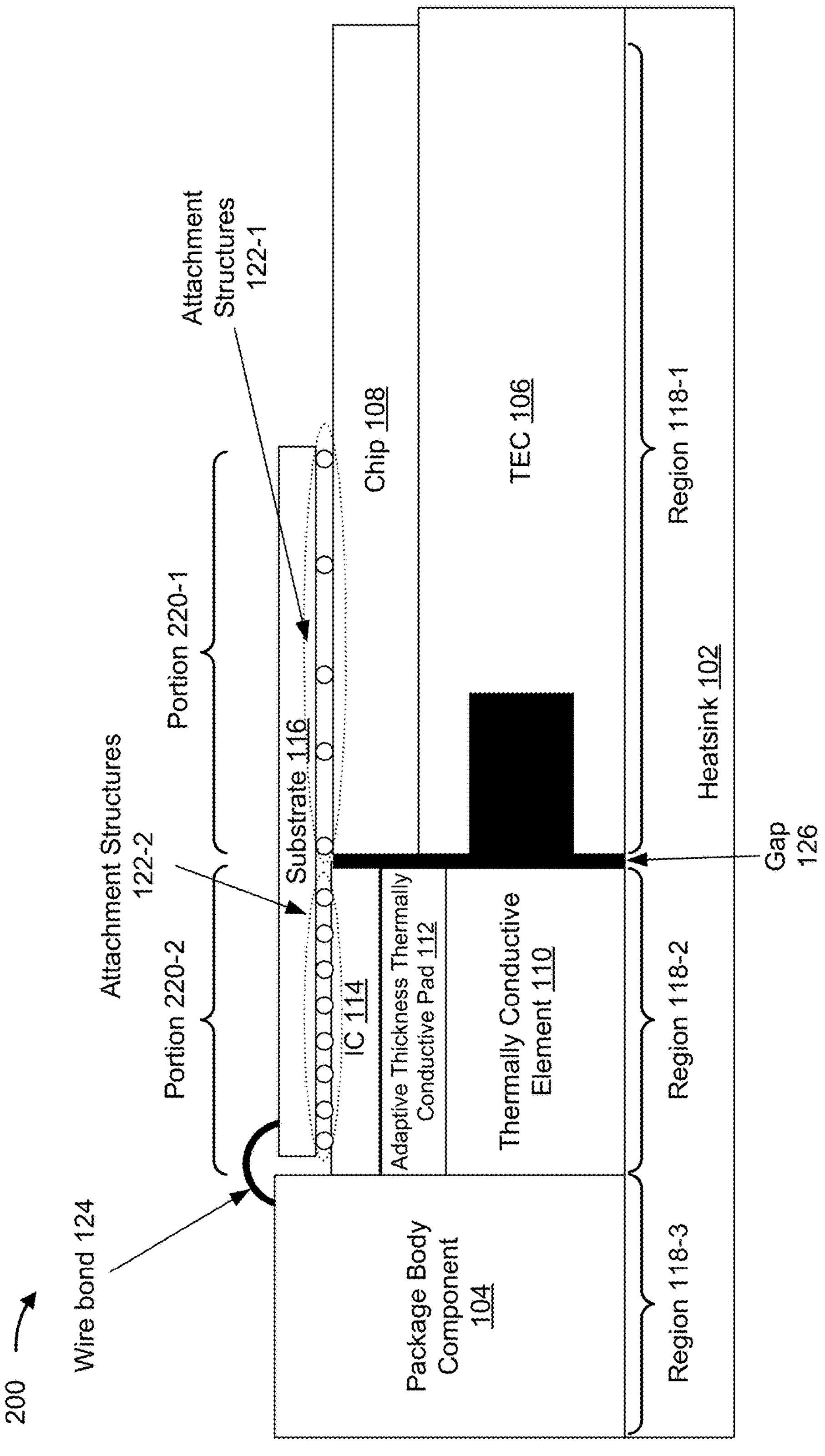
FIGS. 2A-2B are diagrams of an example opto-electrical device described herein.
Figure 2B:
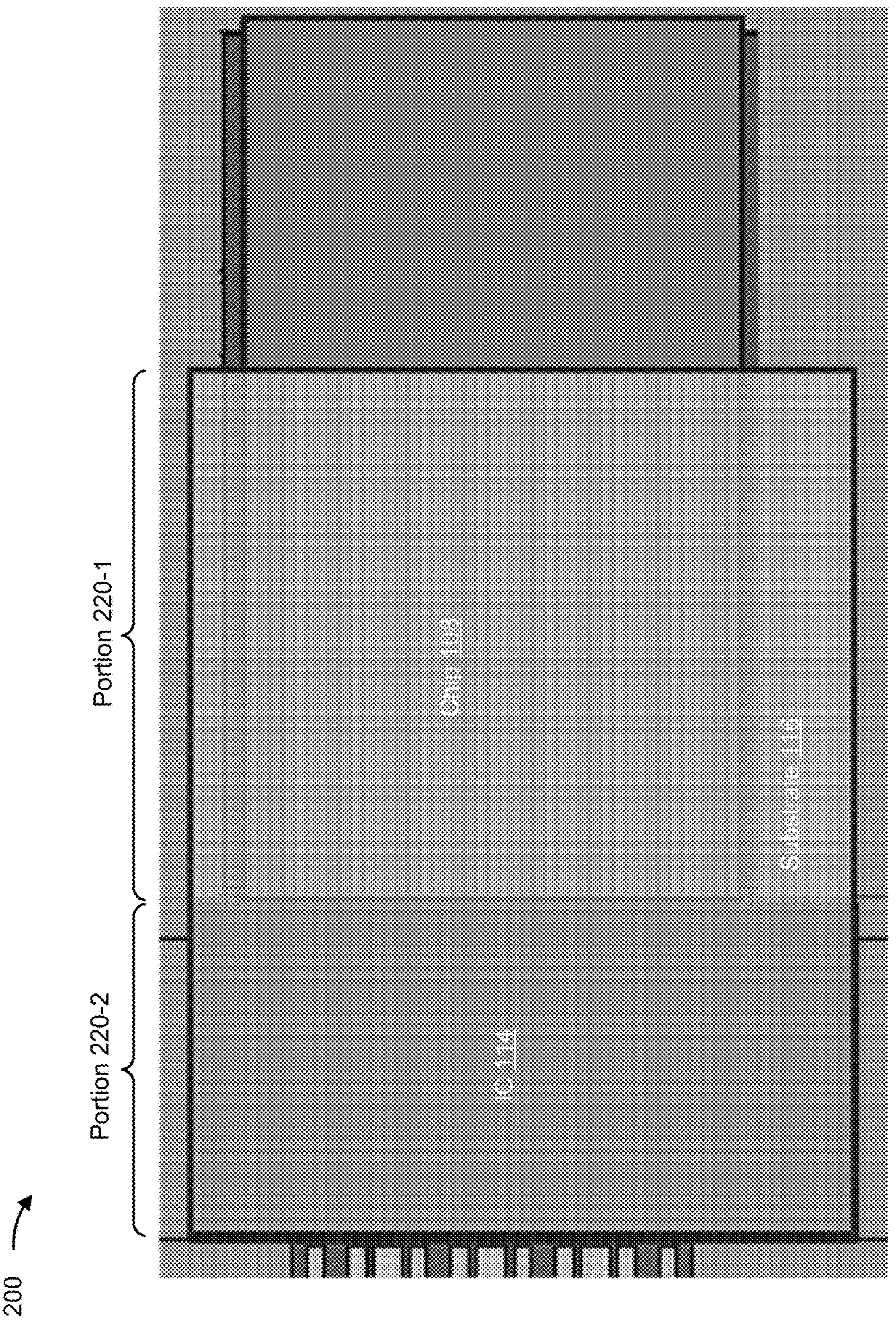

FIGS. 2A-2B are diagrams of an example opto-electrical device 200. FIG. 2A illustrates a side cut-away view of the example opto-electrical device 200. FIG. 2B illustrates a top view of the example opto-electrical device 200.

The opto-electrical device 200 may be similar to the opto-electrical device 100. For example, as shown in FIGS. 2A-2B, the example opto-electrical device 200 may include a heatsink 102, a package body component 104, a TEC 106, a chip 108, a thermally conductive element 110, an adaptive thickness thermally conductive pad 112, an IC 114, a substrate 116, one or more attachment structures 122, and at least one wire bond 124 (e.g., in a same or similar configuration as described herein in relation to FIGS. 1A and 1B).

As shown in FIGS. 2A-2B, the substrate 116 may have a different shape and/or size when included in the opto-electrical device 200 (e.g., as compared to when the substrate 116 is included in the opto-electrical device 100). A first portion 220-1 of the substrate 116 may be disposed on the chip 108 and a second portion 220-2 of the substrate 116 may be disposed on the IC 114. For example, as shown in FIG. 2A, a region of a bottom surface of the substrate 116 that is associated with the first portion 220-1 of the substrate 116 may be disposed on a top surface of the chip 108, and a region of the bottom surface of the substrate 116 that is associated with the second portion 220-2 of the substrate 116 may be disposed on a top surface of the IC 114. As further shown in FIGS. 2A-2B, the first portion 220-1 of the substrate 116 may be disposed on a portion of the top surface of the chip 108 and the second portion 220-2 of the substrate 116 may be disposed on an entirety of the top surface of the IC 114. In this way, the substrate 116 may have a reduced shape and/or size when included in the opto-electrical device 200 (e.g., as compared to when the substrate 116 is included in the opto-electrical device 100), which may reduce a cost of producing the substrate 116, may increase a manufacturability of the substrate 116, and/or may enable a different level of robustness and/or reliability of the substrate 116, among other examples.

As indicated above, FIGS. 2A-2B are provided as an example. Other examples may differ from what is described with regard to FIGS. 2A-2B. In practice, the opto-electrical device 200 may include additional layers and/or elements, fewer layers and/or elements, different layers and/or elements, or differently arranged layers and/or elements than those shown in FIGS. 2A-2B.

Figure 3A:
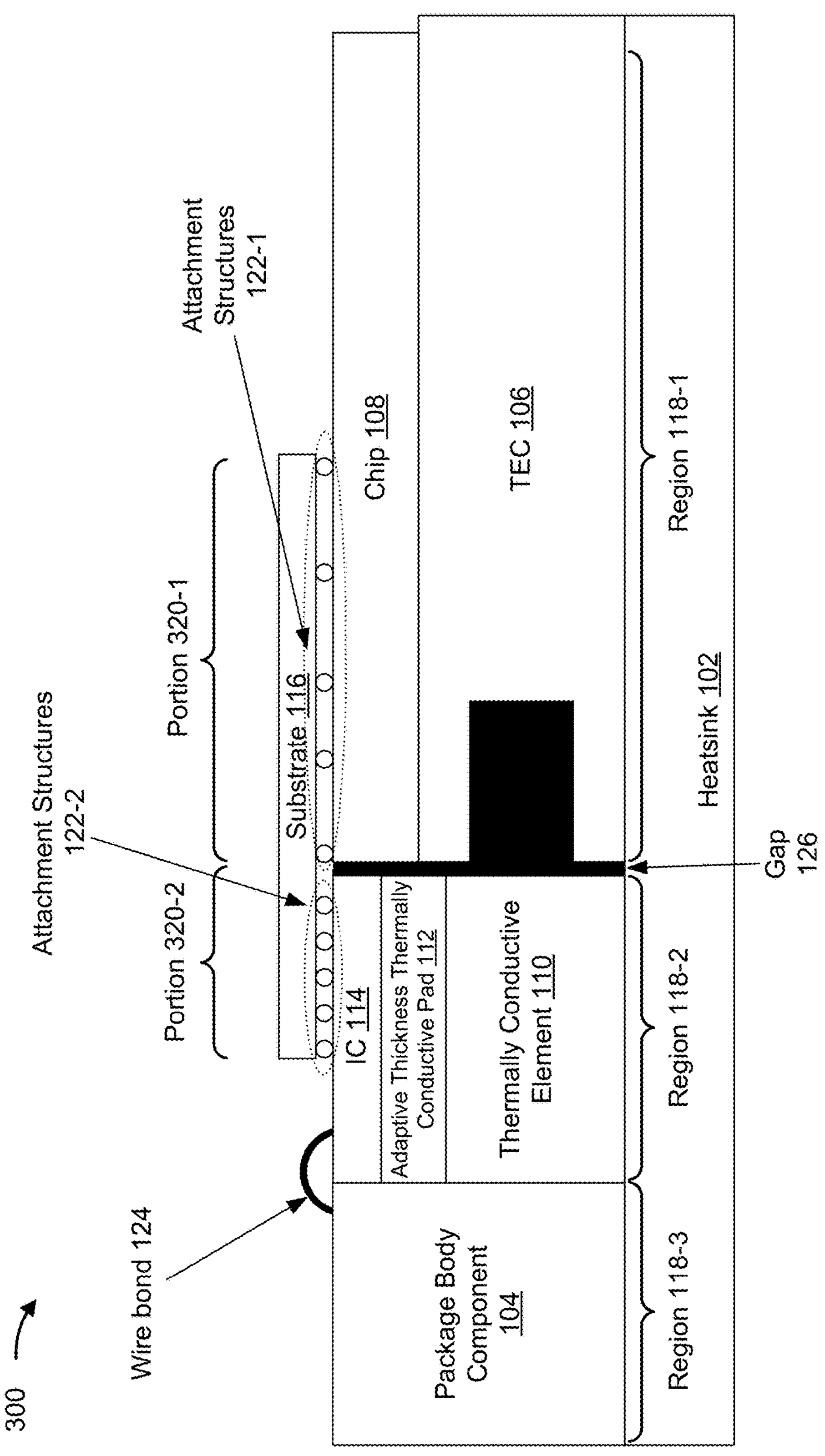
FIGS. 3A-3D are diagrams of an example opto-electrical device described herein.
Figure 3B:
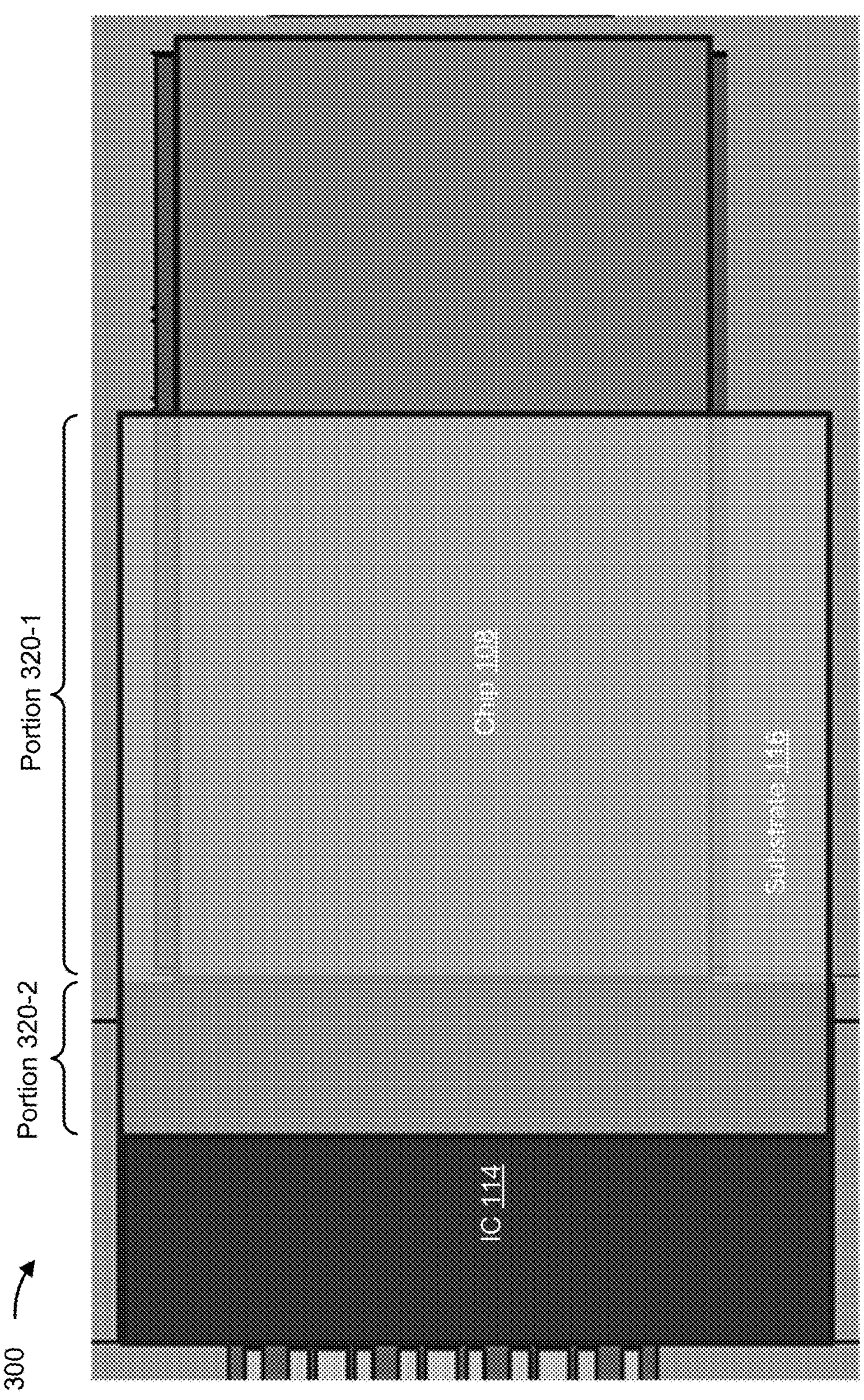
Figure 3C:
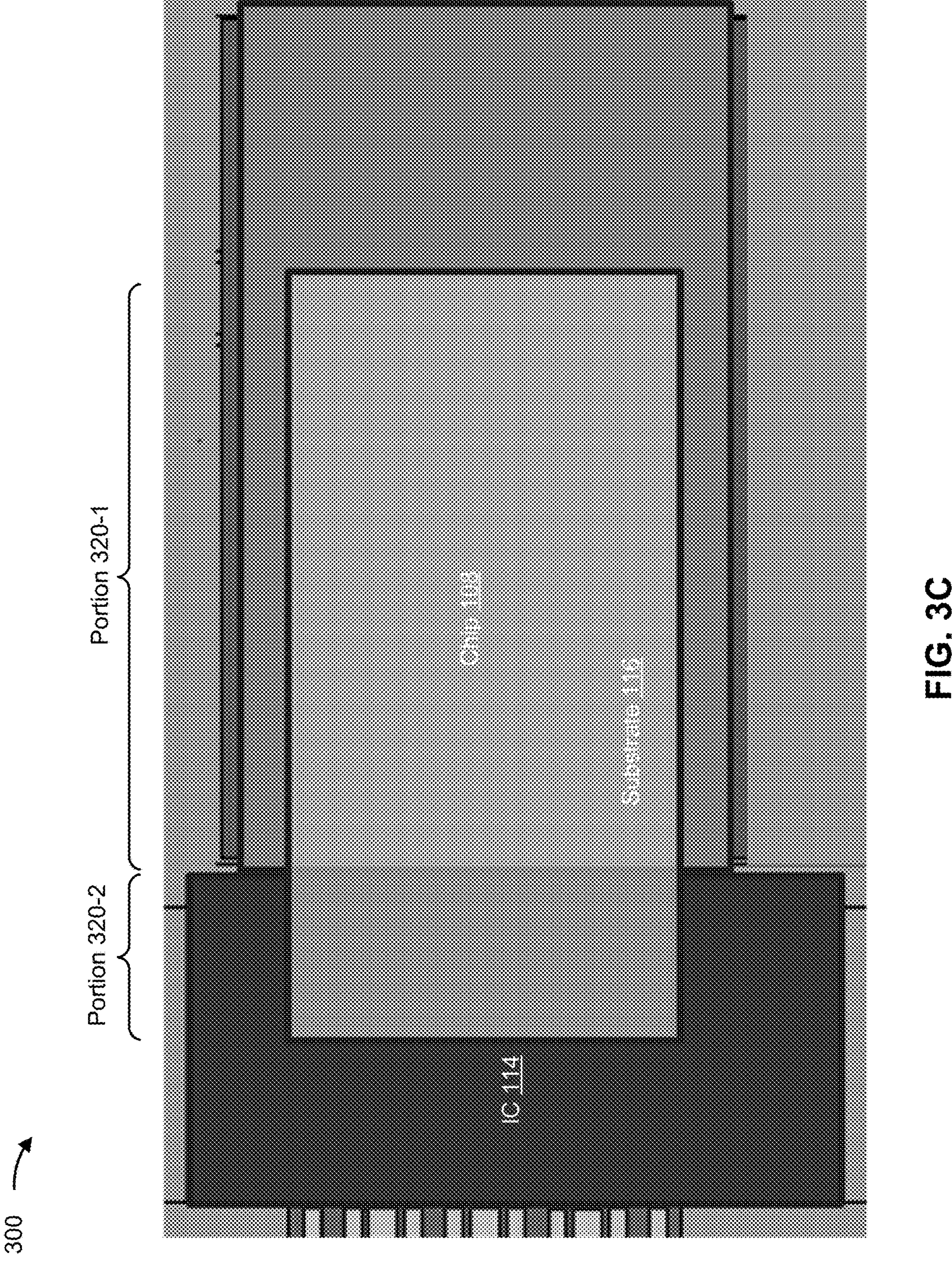
Figure 3D:
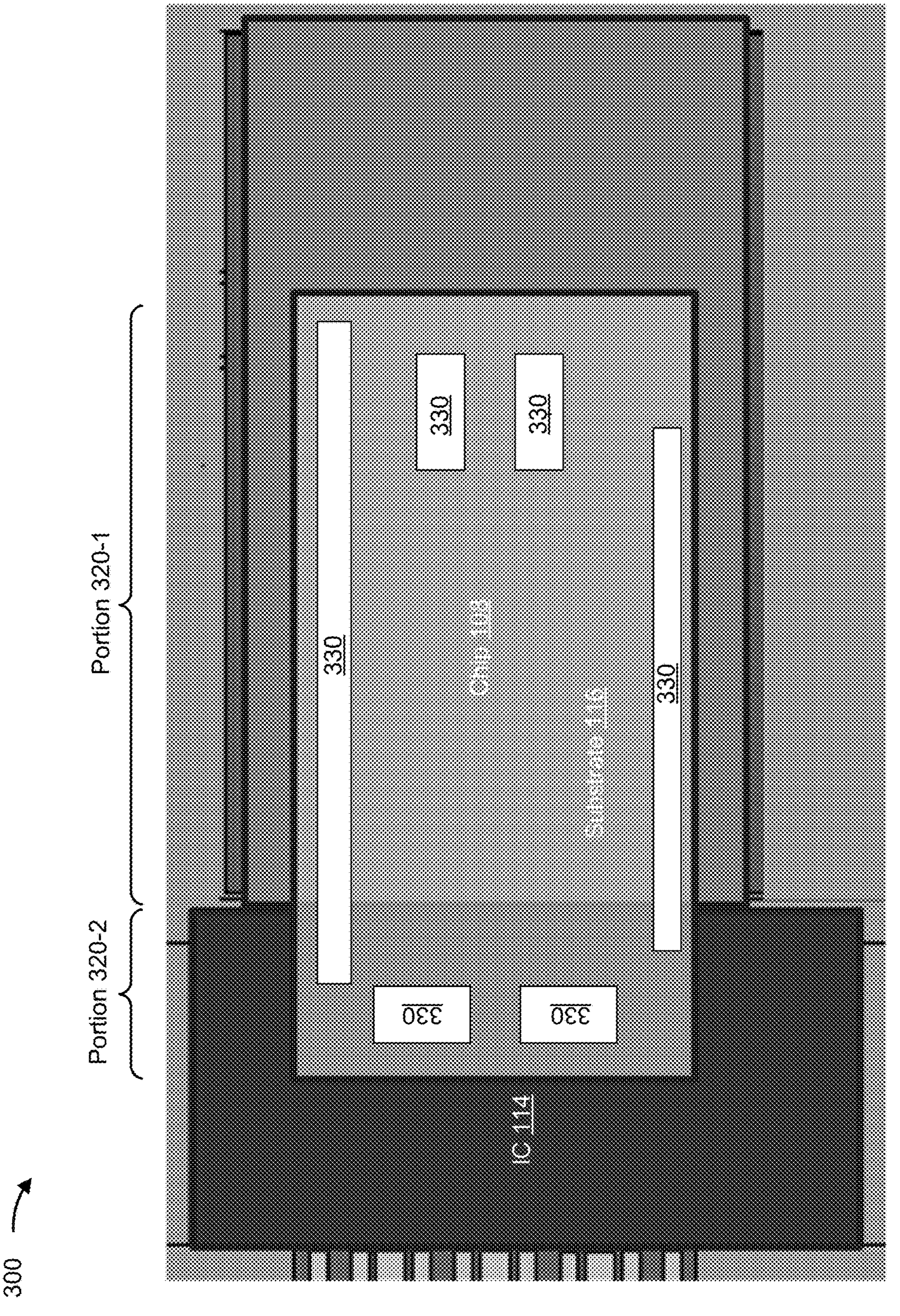

FIGS. 3A-3D are diagrams of an example opto-electrical device 300. FIG. 3A illustrates a side cut-away view of the example opto-electrical device 300. FIG. 3B illustrates a top view of a first configuration of the example opto-electrical device 300, FIG. 3C illustrates a top view of a second configuration of the example opto-electrical device 300, and FIG. 3D illustrates a top view of a third configuration of the example opto-electrical device 300.

The opto-electrical device 300 may be similar to the opto-electrical device 100. For example, as shown in FIGS. 3A-3D, the example opto-electrical device 300 may include a heatsink 102, a package body component 104, a TEC 106, a chip 108, a thermally conductive element 110, an adaptive thickness thermally conductive pad 112, an IC 114, a substrate 116, one or more attachment structures 122, and at least one wire bond 124 (e.g., in a same or similar configuration as described herein in relation to FIGS. 1A and 1B).

As shown in FIGS. 3A-3D, the substrate 116 may have a different shape and/or size when included in the opto-electrical device 300 (e.g., as compared to when the substrate 116 is included in the opto-electrical device 100). A first portion 320-1 of the substrate 116 may be disposed on the chip 108 and a second portion 320-2 of the substrate 116 may be disposed on the IC 114. For example, as shown in FIG. 3A, a region of a bottom surface of the substrate 116 that is associated with the first portion 320-1 of the substrate 116 may be disposed on a top surface of the chip 108, and a region of the bottom surface of the substrate 116 that is associated with the second portion 320-2 of the substrate 116 may be disposed on a top surface of the IC 114. As another example, FIG. 3B shows that the first portion 320-1 of the substrate 116 may be disposed on a particular portion of the top surface of the chip 108, and FIGS. 3C-3D show that the first portion 320-1 of the substrate 116 may be disposed on a different portion of the top surface of the chip 108. In an additional example, FIG. 3B shows that the second portion 320-2 of the substrate 116 may be disposed on a particular portion of the top surface of the IC 114, and FIGS. 3C-3D show that the second portion 320-2 of the substrate 116 may be disposed on a different portion of the top surface of the IC 114. In this way, the substrate 116 may have a reduced shape and/or size when included in the opto-electrical device 300 (e.g., as compared to when the substrate 116 is included in the opto-electrical device 100), which may reduce a cost of producing the substrate 116, may increase a manufacturability of the substrate 116, and/or may enable a different level of robustness and/or reliability of the substrate 116, among other examples.

As further shown in FIG. 3D, the substrate 116 may include one or more electrical elements 330 (e.g., that are the same as or similar to the one or more electrical elements described herein in relation to FIGS. 1A-1B). For example, the substrate 116 may include one or more resistors, one or more traces (e.g., one or more low frequency traces), and/or one or more other electrical elements on a surface, such as a top surface, of the substrate 116 or within the substrate 116. The one or more electrical elements 330 may be connected to the chip 108 and/or the IC 114 via one or more electrically conductive structures of substrate 116 (e.g., as described herein in relation to FIGS. 1A-1B). In some implementations, the substrate 116 may include one or more electrical elements 330 that would otherwise be included in the chip 108 and/or IC 114 (e.g., if the substrate 116 were not present to electrically connect the IC 114 and the chip 108).

In some implementations, the one or more electrical elements 330 may complete the chip 108 and/or the IC 114. For example, the chip 108 may include a first set of electrical elements of an opto-electrical chip and the substrate 116 may include a second set of electrical elements of the opto-electrical chip (e.g., that includes at least some of the one or more electrical elements 330), such that, together, the first set of electrical elements and the second set of electrical elements form the opto-electrical device-electrical chip. As another example, the IC 114 may include a first set of electrical elements of a driver and/or a TIA and the substrate 116 may include a second set of electrical elements of the driver and/or the TIA (e.g., that includes at least some of the one or more electrical elements 330), such that, together, the first set of electrical elements and the second set of electrical elements form the driver and/or the TIA. In this way, an electrical complexity, a size (e.g., a lateral footprint), and/or a power consumption requirement of the chip 108 and/or the IC 114 may be respectively reduced (e.g., by including sets of the one or more electrical elements 330, as described above, in the substrate 116).

As further shown in FIG. 3A, at least one wire bond 124 may connect the package body component 104 (e.g., an interconnection of the package body component 104) to the IC 114 instead of connecting the package body component 104 to the substrate 116 as in FIGS. 1A and 2A. For example, the at least one wire bond 124 may directly connect the package body component 104 to the IC 114 (e.g., because the substrate 116 is disposed over only a portion of the IC 114, which allows space for the at least one wire bond 124 to directly connect the package body component 104 to the IC 114). A thickness (e.g., a height as shown in FIG. 3A) of the package body component 104 may be adjusted (e.g., as compared to what is shown FIGS. 1A and 2A) to minimize a length of the wire bond 124 (e.g., to minimize an amount of inductance associated with the wire bond 124 and therefore facilitate a high RF connection between the package body component 104 and the IC 114).

As indicated above, FIGS. 3A-3D are provided as an example. Other examples may differ from what is described with regard to FIGS. 3A-3D. In practice, the opto-electrical device 300 may include additional layers and/or elements, fewer layers and/or elements, different layers and/or elements, or differently arranged layers and/or elements than those shown in FIGS. 3A-3D.

Figure 4A:
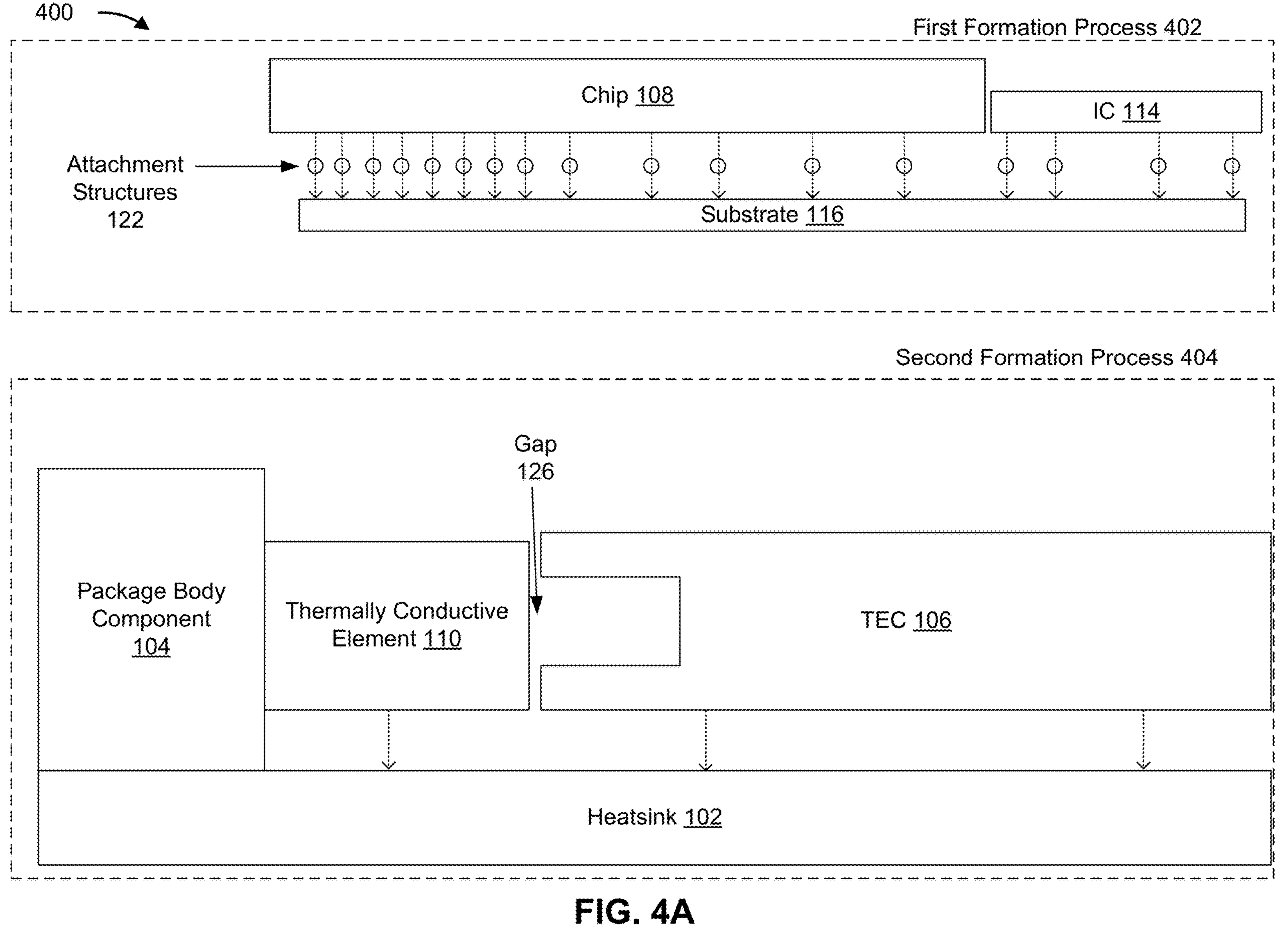
FIGS. 4A-4C are diagrams of an example implementation of a process for forming an opto-electrical device described herein.
Figure 4B:
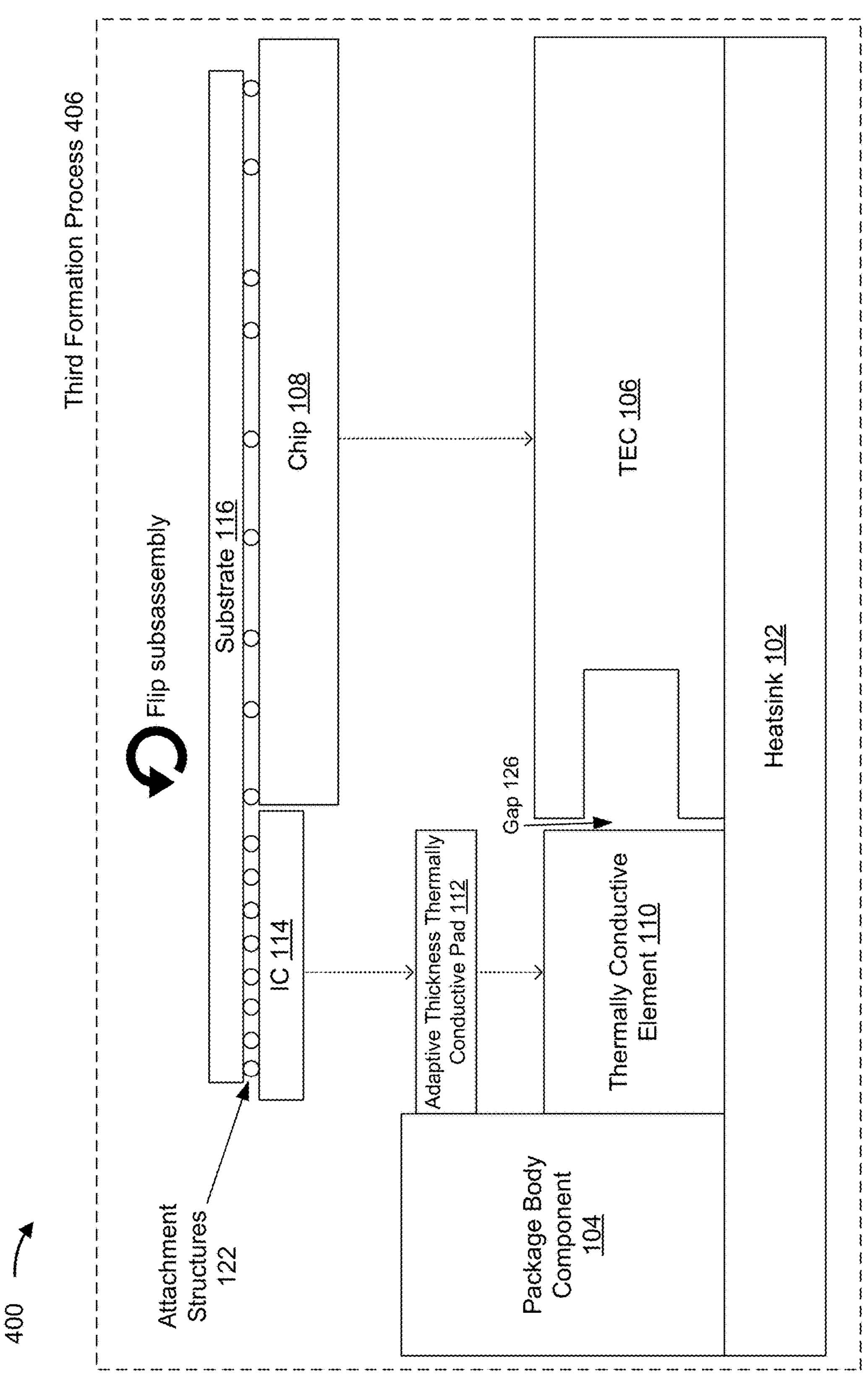
Figure 4C:
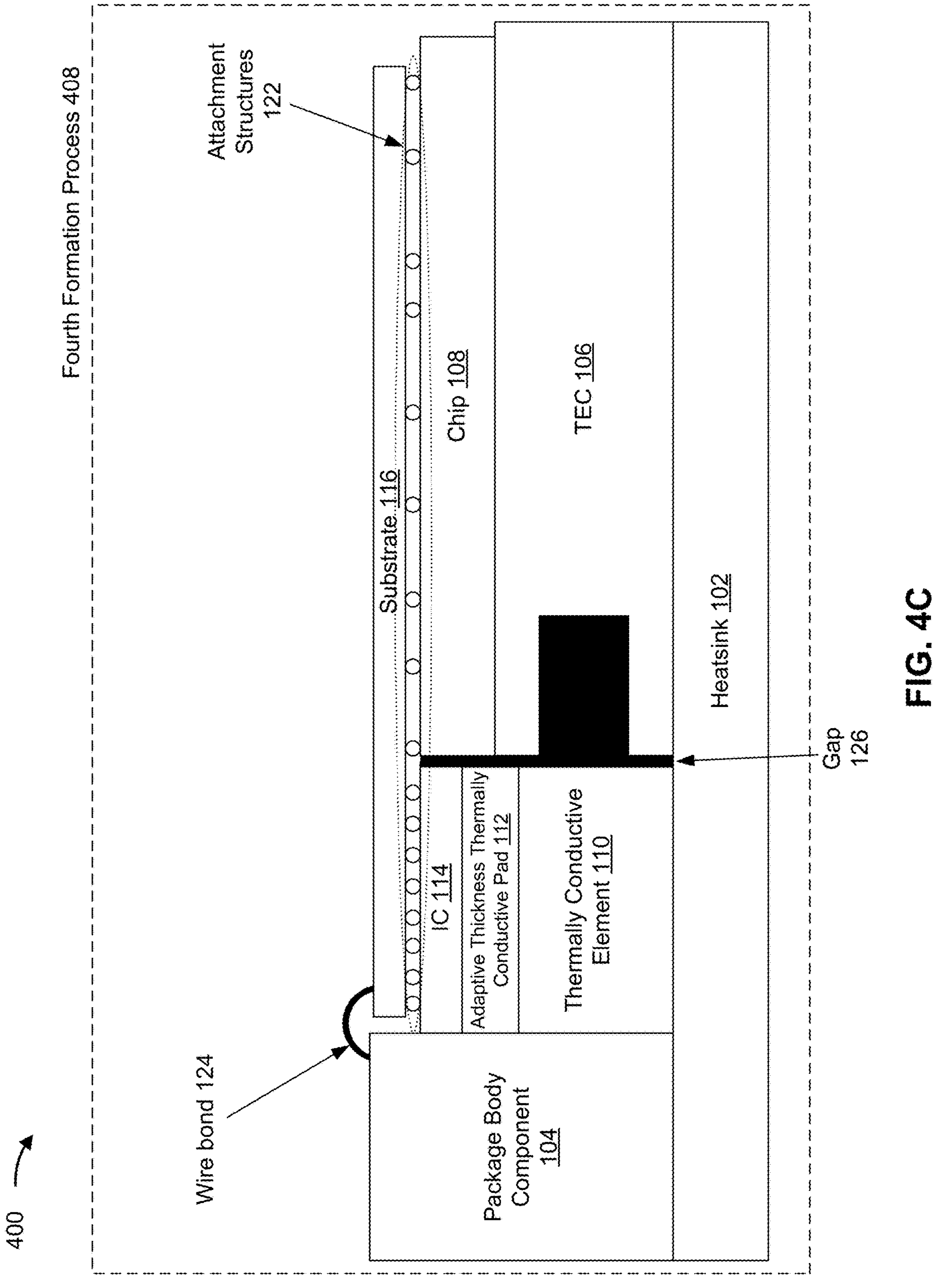

FIGS. 4A-4C are diagrams of an example implementation 400 of a process for forming an opto-electrical device (e.g., that is the same as, or similar to, the opto-electrical device 100, the opto-electrical device 200, and/or the opto-electrical device 300 described herein in relation to FIGS. 1A-1B, 2A-2B, and 3A-3D). The process may be, for example, a flip-chip die bonding process. As shown in FIGS. 4A-4C, the process may include a first formation process 402, a second formation process 404, a third formation process 406, and/or a fourth formation process 408.

As shown in FIG. 4A, the process includes disposing the chip 108 and the IC 114 on the substrate 116 during the first formation process 402. The first formation process 402 may include connecting the chip 108 and/or IC 114 to the substrate 116 via the one or more attachment structures 122 (e.g., by using a solder reflow process). For example, the first formation process 402 may include disposing the chip 108 and the IC 114 on respective regions of a surface of the substrate 116 (e.g., that includes bondpads and/or attachment structures of the substrate 116); forming a first set of the one or more attachment structures that are configured to provide an electrical connection and/or a mechanical connection between or around the bondpads of the substrate 116 and corresponding bondpads of the chip 108 and the IC 114; and/or forming a second set of the one or more attachment structures that are configured to provide a mechanical connection between or around the attachment structures of the substrate 116 and corresponding attachment structures of the chip 108 and the IC 114.

As further shown in FIG. 4A, the process includes disposing the TEC 106 and/or the thermally conductive element 110 on a package that includes, for example, the package body component 104 and the heatsink 102 during the second formation process 404. The second formation process 404 may include connecting the chip 108 and/or IC 114 to the substrate 116 via an attachment material, such as an epoxy (e.g., a thermally conductive epoxy), a solder, or a similar material. For example, the second formation process 404 may include disposing the attachment material on the heatsink 102 and disposing the TEC 106 and/or the thermally conductive element 110 on the heatsink 102. In some implementations, the TEC 106 and the thermally conductive element 110 may be disposed on the heatsink such that the gap 126 is disposed between the TEC 106 and the thermally conductive element 110 (e.g., to ensure that the TEC 106 and the thermally conductive element 110 do not touch each other during or after formation of the opto-electrical device 100).

In some implementations, the first formation process 402 and the second formation process 404 may be performed contemporaneously (e.g., some or all of the first formation process 402 may be performed when the second formation process 404 is performed) or separately (e.g., the first formation process 402 may be performed prior to performance of the second formation process 404, or vice versa).

As shown in FIG. 4B, the process includes disposing a first subassembly that includes the chip 108, the IC 114 and the substrate 116 on a second subassembly that includes the package (e.g., comprising the heatsink 102 and the package body component 104), the TEC 106, and/or the thermally conductive element 110 during the third formation process 406. Prior to disposing the first subassembly on the second subassembly, the third formation process 406 may include orienting (e.g., flipping) the first subassembly (e.g., as is consistent with a flip-chip die bonding process), such that the chip 108 and the IC 114 of the first subassembly are configured to face the package body component 104, the TEC 106, and the thermally conductive element 110 of the second subassembly.

Further, the third formation process 406 may include disposing the adaptive thickness thermally conductive pad 112 between the thermally conductive element 110 and the IC 114. For example, the third formation process 406 may include disposing the adaptive thickness thermally conductive pad 112 on the thermally conductive element 110 of the second subassembly and disposing the first subassembly on the second subassembly such that the IC 114 is disposed on the adaptive thickness thermally conductive pad 112 and the chip 108 is disposed on the TEC 106. The adaptive thickness thermally conductive pad 112 may be "soft" when initially disposed on the thermally conductive element 110 and may compress to fill a space (e.g., to conform to one or more dimensions of the space, such as a length, width, and thickness of the space) between the thermally conductive element 110 and the IC 114 when the first subassembly is disposed on the second subassembly. In some implementations, the adaptive thickness thermally conductive pad 112 may have a particular thickness (e.g., when the adaptive thickness thermally conductive pad 112 is soft), such that a thickness (e.g., a vertical height) of a first substructure comprising thermally conductive element 110, the adaptive thickness thermally conductive pad 112, and the IC 114 (e.g., as described herein in relation to FIGS. 1A-1B) is greater than a thickness (e.g., a vertical height) of a second substructure comprising the TEC 106 and the chip 108 when the first subassembly is disposed on the second subassembly. A compressive force (e.g., that is enough to compress the adaptive thickness thermally conductive pad 112, but not enough to damage any other component of the opto-electrical device 100) may be applied to the first subassembly (e.g., in a downward direction) to cause the adaptive thickness thermally conductive pad 112 to compress (e.g., while the adaptive thickness thermally conductive pad 112 is soft) such that the thickness of the first substructure matches (e.g., is equal to, within a tolerance, such as less than or equal to 50 μm) the thickness of the second substructure.

After the first subassembly has been disposed on the second subassembly, the adaptive thickness thermally conductive pad 112 may cure (e.g., by applying heat) and may thereby become "hard," such that the adaptive thickness thermally conductive pad 112 is minimally compressible due to pressure changes, temperature changes, or other environmental changes after the third formation process 406 (e.g., after curing). In some implementations, the third formation process 406 may include disposing an attachment material, such as an epoxy (e.g., a thermally conductive epoxy), a solder, or a similar material, on the TEC 106 prior to disposing the first subassembly on the second subassembly (e.g., to mechanically connect the chip 108 to the TEC 106).

While FIG. 4B illustrates disposing the first subassembly on the second subassembly, in some implementations the third formation process 406 includes orienting (e.g., flipping) the second subassembly and disposing the second subassembly on the first subassembly in a similar manner as described above. For example, the third formation process 406 may further include disposing the adaptive thickness thermally conductive pad 112 on the IC 114 of the first subassembly and disposing the second subassembly on the first subassembly such that the thermally conductive element 110 is disposed on the adaptive thickness thermally conductive pad 112 and the TEC 106 is disposed on the chip 108. Additionally, or alternatively, the third formation process 406 may include disposing an attachment material on the chip 108 prior to disposing the second subassembly on the first subassembly (e.g., to mechanically connect the chip 108 to the TEC 106).

As shown in FIG. 4C, the process includes electrically connecting the package body component 104 to the substrate 116, the chip 108, and/or the IC 114 during the fourth formation process 408. For example, the fourth formation process 408 may include connecting the package body component 104 to the substrate 116 via the at least one wire bond 124. As an alternative example, the fourth formation process 408 may include connecting the package body component 104 to the IC 114 and/or the chip 108 via the at least one wire bond (e.g., when there is space for a wire bond, such as described herein in relation to FIG. 3A).

In this way, the process may be used to form (or assemble) the opto-electrical device.

As indicated above, FIGS. 4A-4C are provided as an example. Other examples may differ from what is described with regard to FIGS. 4A-4C. In practice, the process may include forming additional layers and/or structures, fewer layers and/or structures, different layers and/or structures, or differently arranged layers and/or structures than those shown in FIGS. 4A-4C.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An opto-electrical device, comprising:

a heatsink;

a first substructure disposed on the heatsink that includes:

a thermally conductive element, an adaptive thickness thermally conductive pad disposed on the thermally conductive element, wherein the adaptive thickness thermally conductive pad is compressible, and an integrated circuit (IC) disposed on the adaptive thickness thermally conductive pad;

a second substructure disposed on the heatsink that includes:

a thermoelectric cooler (TEC), and an opto-electrical chip disposed on the TEC;

a substrate disposed on the first substructure and the second substructure, wherein the substrate is disposed on the IC and the opto-electrical chip, and wherein the substrate is configured to electrically connect the IC and the opto-electrical chip; and attachment structures directly connecting a surface of the substrate to the IC and directly connecting the surface of the substrate to the opto-electrical chip.

2. The opto-electrical device of claim 1, wherein the substrate is connected to the IC and the opto-electrical chip via the attachment structures in a flip-chip configuration.

3. The opto-electrical device of claim 2, wherein the attachment structures include at least one of:

an attachment structure that provides a mechanical connection;

an attachment structure that provides an electrical connection; or an attachment structure that provides a mechanical connection and an electrical connection.

4. The opto-electrical device of claim 1, wherein a difference between a thickness of the first substructure and a thickness of the second substructure satisfies a difference threshold, wherein the difference threshold is less than or equal to 50 micrometers.

5. The opto-electrical device of claim 1, wherein the adaptive thickness thermally conductive pad comprises at least one of a resin or a polymer.

6. The opto-electrical device of claim 1, wherein the substrate is disposed on the first substructure and the second substructure such that the substrate is substantially parallel, within a threshold number of degrees, to a horizontal plane associated with the opto-electrical device.

7. The opto-electrical device of claim 1, wherein the second substructure further includes an additional adaptive thickness thermally conductive pad, wherein the additional adaptive thickness thermally conductive pad is disposed on the TEC or the TEC is disposed on the additional adaptive thickness thermally conductive pad.

8. The opto-electrical device of claim 1, wherein the thermally conductive element, the adaptive thickness thermally conductive pad, and the TEC are configured to thermally conduct heat in a same vertical direction to the heatsink.

9. The opto-electrical device of claim 1, wherein the substrate includes one or more electrical elements, wherein an electrical element, of the one or more electrical elements, provides a functionality associated with operation of the IC or a functionality associated with operation of the opto-electrical chip.

10. The opto-electrical device of claim 1, wherein a gap exists between the first substructure and the second substructure.

11. An opto-electrical device, comprising:

a heatsink;

a thermally conductive element disposed on a first region of a surface of the heatsink;

an adaptive thickness thermally conductive pad disposed on the thermally conductive element, wherein the adaptive thickness thermally conductive pad is compressible;

an integrated circuit (IC) disposed on the adaptive thickness thermally conductive pad;

a thermoelectric cooler (TEC) disposed on a second region of the surface of the heatsink;

an opto-electrical chip disposed on the TEC;

a substrate disposed on the IC and the opto-electrical chip, wherein the substrate is configured to electrically connect the IC and the opto-electrical chip; and a plurality of attachment structures directly connecting a surface of the substrate to the IC and directly connecting the surface of the substrate to the opto-electrical chip.

12. The opto-electrical device of claim 11, wherein the substrate has a flip-chip profile.

13. The opto-electrical device of claim 12, wherein the plurality of attachment structures includes at least one of:

a non-metal-doped solder ball; or a metal-doped solder ball.

14. The opto-electrical device of claim 11, wherein a thickness of the adaptive thickness thermally conductive pad while compressed matches a difference between a cumulative thickness of the opto-electrical chip and the TEC and a cumulative thickness of the thermally conductive element and the IC.

15. The opto-electrical device of claim 11, wherein the substrate is disposed on the IC and the opto-electrical chip such that the substrate is substantially parallel, within a threshold number of degrees, to a horizontal plane associated with the opto-electrical device.

16. The opto-electrical device of claim 11, wherein the thermally conductive element, the adaptive thickness thermally conductive pad, and the TEC are configured to thermally conduct heat in a same vertical direction to the heatsink.

17. The opto-electrical device of claim 11, wherein the substrate includes one or more electrically conductive structures that are configured to electrically connect the IC and the opto-electrical chip.

18. An opto-electrical device, comprising:

a heatsink;

a thermally conductive element disposed on a first region of a surface of the heatsink;

an adaptive thickness thermally conductive pad disposed on the thermally conductive element, wherein the adaptive thickness thermally conductive pad is compressible;

an integrated circuit (IC) disposed on the adaptive thickness thermally conductive pad;

a thermoelectric cooler (TEC) disposed on a second region of the surface of the heatsink;

an opto-electrical chip disposed on the TEC;

a package body component disposed on a third region of the surface of the heatsink;

a substrate disposed on the IC and the opto-electrical chip, wherein the substrate is configured to electrically connect the IC and the opto-electrical chip; and a plurality of attachment structures directly connecting a surface of the substrate to the IC and directly connecting the surface of the substrate to the opto-electrical chip.

19. The opto-electrical device of claim 18, further comprising:

a wire bond connecting the package body component to the substrate.

20. The opto-electrical device of claim 18, wherein the adaptive thickness thermally conductive pad comprises at least one of a resin or a polymer.

* * * * *